(12) United States Patent
Ishinoda

(10) Patent No.: US 6,698,488 B2
(45) Date of Patent: Mar. 2, 2004

(54) APPARATUS FOR STICKING A TAPE ONTO A SEMICONDUCTOR WAFER AND METHOD OF STICKING THE TAPE

(75) Inventor: Mutsuo Ishinoda, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 75 days.

(21) Appl. No.: 09/975,561

(22) Filed: Oct. 12, 2001

(65) Prior Publication Data

US 2002/0056523 A1 May 16, 2002

(30) Foreign Application Priority Data

Oct. 16, 2000 (JP) .......................................... 2000-314989

(51) Int. Cl.[7] .................. H01L 21/30; H01L 21/301; B32B 31/18
(52) U.S. Cl. .................. 156/496; 156/229; 156/494; 156/495; 156/516; 156/522
(58) Field of Search .................. 156/229, 253, 156/667, 522, 582, 583.1, 580, 581, 523, 530, 552, 494, 495, 496, 516

(56) References Cited

U.S. PATENT DOCUMENTS 3,558,254 A * 1/1971 Cahill .......................... 83/176
3,951,726 A * 4/1976 Found .......................... 156/527
4,059,203 A * 11/1977 Wright .......................... 221/73
4,925,515 A * 5/1990 Yoshimura et al. .......... 156/250
5,472,554 A 12/1995 Ko et al.
5,676,298 A * 10/1997 Shing-Tak Lam ............ 226/88
5,961,768 A * 10/1999 Tsujimoto .................... 156/285
6,080,263 A * 6/2000 Saito et al. ................... 156/253

FOREIGN PATENT DOCUMENTS

JP    07-211675       8/1995
JP    09306141 A  *  11/1997  .......... G11B/23/113

* cited by examiner

Primary Examiner—Richard Crispino
Assistant Examiner—Sue A. Purvis
(74) Attorney, Agent, or Firm—Rabin & Berdo, PC

(57) ABSTRACT

The apparatus for sticking a tape onto a semiconductor wafer comprises a winding tape roll for winding a tape wound around a tape roll, a taper roller having a diameter which is tapered or reduced toward both ends thereof, a wafer table mounting thereon a semiconductor wafer which is taken out from a wafer carrier station and positioning the wafer thereon, an orientation flat cutter and a circumferential cutter.

15 Claims, 3 Drawing Sheets

APPARATUS FOR STICKING A TAPE ONTO A SEMICONDUCTOR WAFER AND METHOD OF STICKING THE TAPE

BACKGROUND OF THE INVENTION

1. Field of the Invention

The invention relates to an apparatus for sticking a tape and a method of sticking the tape, particularly to an apparatus for sticking a tape onto a semiconductor wafer and a method of sticking the tape onto the semiconductor wafer in a process of fabricating a semiconductor device.

2. Description of the Related Art

A semiconductor chip requires a step of polishing a back surface of a semiconductor wafer after a variety of circuit patterns are formed on the front surface of the semiconductor wafer. At this time, a polishing step is carried out after a tape is in advance stuck onto the front surface of the semiconductor wafer so as to protect the front surface of the semiconductor wafer on which a variety of circuit patterns are formed.

Further, the semiconductor chip is fabricated through a dicing step for cutting the semiconductor wafer into respective semiconductor chips upon completion of the steps of forming a variety of circuit patters on the front surface of the semiconductor wafer and polishing the back surface thereof. At that time, the dicing step is carried out after the back surface of the semiconductor wafer is in advance stuck onto a tape which is fixed to a frame ring to prevent the individual semiconductor chips from scattering in pieces when the semiconductor wafer is cut. Still further, a so-called WCSP (Wafer Level Chip Size Package) technique has been widely known recently, namely, a semiconductor wafer is packaged as it is, then it is subjected to a dicing, step so as to fabricate individual semiconductor devices.

When a tape is stuck onto a semiconductor wafer, the tape has been conventionally clamped between both ends of the tape in a tape feeding direction and a tape feeding roller and fixed at this state, thereby applying a tension to the tape in a tape feeding direction.

However, in the conventional apparatus for sticking a tape or a conventional method for sticking the tape, since the tape is clamped between both ends of the semiconductor wafer in a tape feeding direction and a tape feeding roller and fixed at this stage when sticking the semiconductor wafer onto the tape, wrinkle or slack is produced on the tape at portion close to the center thereof, or bubbles remain between the semiconductor wafer and the tape. As a result, an adhesive strength between the tape and the semiconductor wafer becomes weak, causing a fear that the semiconductor chip or semiconductor device is fallen off from the tape and it is scattered.

SUMMARY OF THE INVENTION

The invention is to provide an apparatus for sticking a tape onto a semiconductor wafer and a method of sticking the tape onto the semiconductor wafer capable of sufficiently maintaining an adhesive strength between the tape and the semiconductor wafer, and also capable of reducing a possibility that a semiconductor chip or a semiconductor device is fallen off from the tape.

The apparatus for sticking a tape onto a semiconductor wafer of the invention is characterized in comprising a first tape roll around which a tape is wound, a second tape roll for winding up the tape unwound from the first tape roll, and a taper roller disposed between the first and second tape rolls and having a diameter which is tapered or reduced toward both ends thereof.

Further, the method of sticking a tape onto the semiconductor wafer of the invention is characterized in comprising sticking the tape onto the semiconductor wafer while applying a tension to the tape in a tape feeding direction as well as in a tape width direction.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

DESCRIPTION OF THE PREFERRED EMBODIMENTS

First Embodiment

Figure 1:
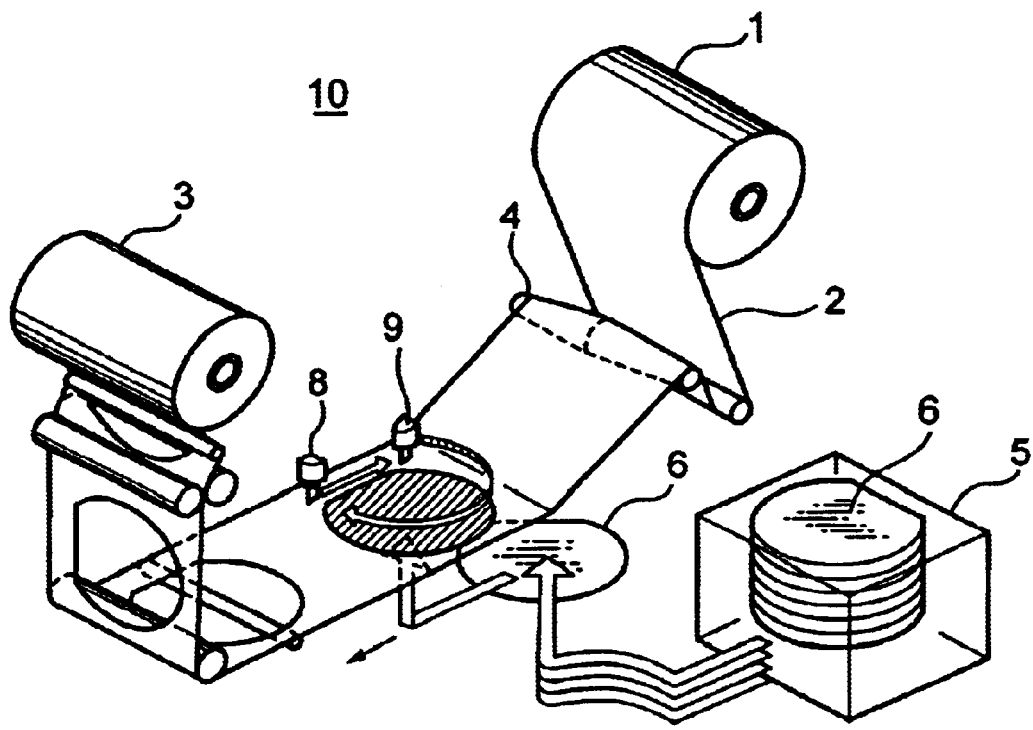
FIG. 1 is a perspective view showing an apparatus for sticking a tape according to a first embodiment of the invention.
Figure 2:
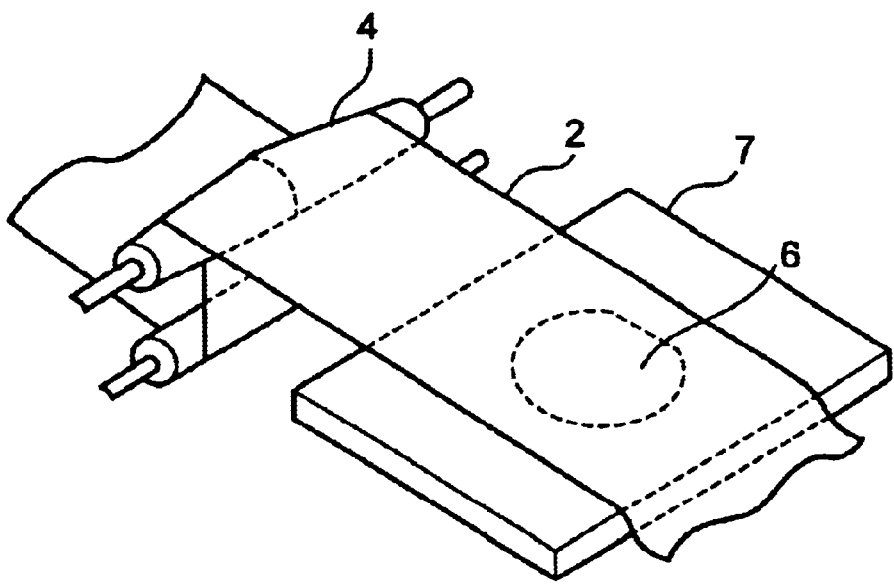
FIG. 2 is a perspective view showing a portion close to a taper roller according to the first embodiment of the invention.

FIG. 1 is a perspective view showing an apparatus for sticking a tape according to a first embodiment of the invention. FIG. 2 is a perspective view showing a portion close to a taper roller according to the first embodiment of the invention. The arrow (←) in FIG. 1 shows a tape feeding direction. The apparatus for sticking a tape (tape sticking apparatus) 10 comprises a winding tape roll 3 for winding a tape 2 wound around a tape roll 1, a taper roller 4 having a diameter which is tapered or reduced toward both ends thereof, a wafer table 7 mounting thereon a semiconductor wafer (hereinafter referred to as wafer) 6 which is taken out from a wafer carrier station 5 and positioning the wafer 6 therein, an orientation flat cutter 8 and a circumferential cutter 9. The taper roller 4 is disposed on the side of a sticking surface of the tape 2 and is pressed by the tape 2 from the lower portion thereof.

An operation of sticking the tape onto the semiconductor wafer by the tape sticking apparatus 10 is now described hereinafter. In the first embodiment, explained hereinafter is a case where a tape is stuck onto the back surface of a semiconductor wafer on which a variety of circuit patterns are not formed, and this sticking step is carried out before a dicing step.

The tape 2 unwound from the tape roll 1 is wound by the winding tape roll 3. At this time, a tension is applied to the tape 2 in the tape feeding (longitudinal) direction, and also another tension is applied to the tape in a tape width lateral) direction when the taper roller 4 is pressed by the tape 2. Subsequently, the wafer 6 having a variety of circuit patterns on the front surface thereof is taken out from the wafer carrier station 5 and is mounted on the wafer table 7 and positioned thereon. The water 6 is disposed to oppose the tape 2 at the back surface where a variety or circuit patterns are not formed. Further, the positioning of the wafer 6 is carried out by the orientation flat alignment of the wafer 6.

Thereafter, the wafer table 7 is raised, and the tape 2 is stuck onto the wafer 6 by a tape sticking roller, not shown. At this time, since not only a tension in the tape feeding direction but also tension in a tape width direction are applied to the tape 2, the production of a wrinkle or a slack can be restrained at the portion close to the center of the tape 2 in the width direction. Thereafter, the tape 2 is cut along the orientation flat of the wafer 6 by the orientation flat cutter 8, and it is also cut along the circumference of the wafer 6 by the circumferential cutter 9. Finally, the wafer 6 stuck onto the tape 2 at the back surface is taken out from the tape sticking apparatus 10, and is transferred to the dicing step.

According to the first embodiment of the invention, the production of a wrinkle or a slack can be restrained at the portion close to the center of the tape 2 in the width direction. As a result, it is possible to sufficiently maintain an adhesive strength between the tape and the semiconductor wafer, and also to reduce a possibility that a semiconductor chip or a semiconductor device is fallen off from the tape.

Second Embodiment

Figure 3:
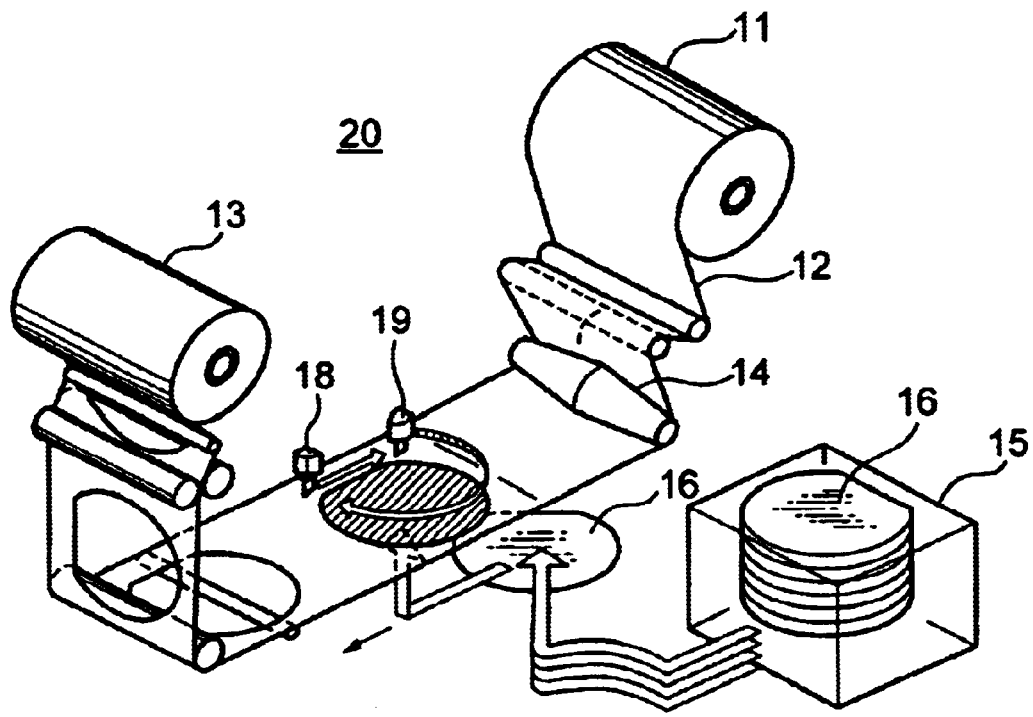
FIG. 3 is a perspective view showing an apparatus for sticking a tape according to a second embodiment of the invention.
Figure 4:
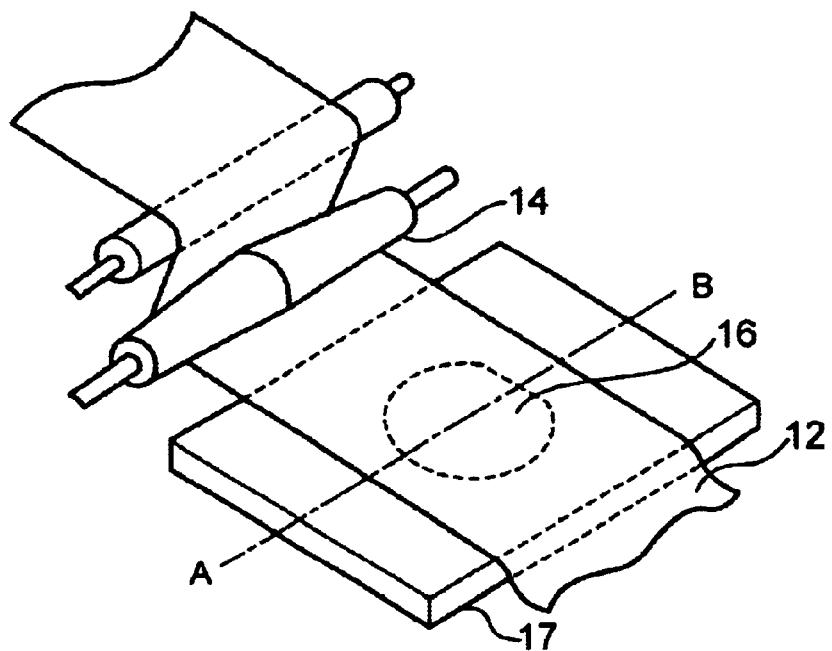
FIG. 4 is a perspective view showing a portion close to a taper roller according to the second embodiment of the invention.
Figure 5:
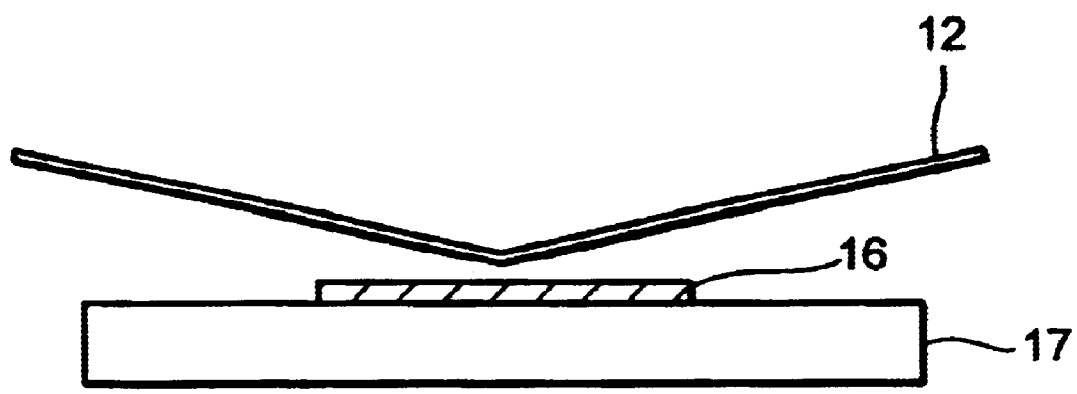
FIG. 5 is a sectional view taken along the line A-B in FIG. 4.

FIG. 3 is a perspective view showing an apparatus for sticking a tape according to a second embodiment of the invention. FIG. 4 is a perspective view showing a portion close to a taper roller according to the second embodiment of the invention. FIG. 5 is a sectional view taken along the line A-B in FIG. 4. The arrow (←) in FIG. 3 shows a tape feeding direction. A tape sticking apparatus 20 comprises a winding tape roll 13 for winding a tape 12 wound around a tape roll 11, a taper roller 14 having a diameter which is tapered or reduced toward both ends thereof, a wafer table 17 mounting thereon a wafer 16 which is taken out from a wafer carrier station 15 and positioning the wafer 16 therein, an orientation flat cutter 18 and a circumferential cutter 19. The taper roller 14 is disposed at the side of a surface (non-sticking surface) opposing a sticking surface of the tape 12 and is pressed by the tape 12 from the upper portion thereof.

An operation of sticking the tape onto the semiconductor wafer by the tape sticking apparatus 20 is now described hereinafter. Likewise the first embodiment, explained hereinafter is a case where a tape is stuck onto the back surface of a semiconductor wafer on which a variety of circuit patterns are not formed, and this sticking step is carried out before a dicing step.

The tape 12 unwound from the tape roll 11 is wound by the winding tape roll 13. At this time, a tension is applied to the tape 12 in a tape feeding direction, and also another tension is applied to the tape in a tape width direction when the taper roller 14 is pressed by the tape 12. Subsequently, the wafer 16 having a variety of circuit patterns on the front surface thereof is taken out from the wafer carrier station 15 and is mounted on the wafer table 17 and positioned thereon. The wafer 16 is disposed to oppose the tape 12 at the back surface where a variety of circuit pattern are not formed. Further, the positioning of the wafer 16 is carried out by the orientation flat alignment of the wafer 16.

Thereafter, the wafer table 17 is raised, and the tape 12 is stuck onto the wafer 16 by a tape sticking roller, not shown. At this time, since not only a tension in the tape feeding direction but also tension in the tape width direction are applied to the tape 12, the production of a wrinkle or a slack can be restrained at the portion close to the center of the tape 12 in the width direction.

Further, in the second embodiment, when the taper roller 14 is pressed against the tape 12, the portion close to the center of the tape 12 in the tape width direction is caused to protrude relative to the back surface (tape sticking surface) of the wafer 16. This state is shown in FIG. 5. The tape 12 is stuck onto the wafer 16 using a tape sticking roller, not shown, while the portion close to the center of the tape 12 in the tape width direction is caused to protrude relative to the back surface of the wafer 16. That is, the tape 12 is stuck subsequently from the portion close to the center line of the wafer 16 toward the periphery thereof. Accordingly, a possibility of production of bubbles between the wafer 16 and the tape 12 can be extremely reduced.

Thereafter, the tape 12 is cut along the orientation flat of the wafer 16 by the orientation flat cutter 18 and it is also cut along the circumference of the wafer 16 by the circumferential cutter 19. Finally, the wafer 16 stuck onto the tape 12 at the back surface is taken out from the tape sticking apparatus 20 and is transferred to a dicing step.

According to the second embodiment of the invention, not only the production of a wrinkle or a slack can by restrained at the portion close to the center of the tape 12 in the width direction, but also the production of bubbles between the semiconductor wafer and the tape can be restrained. As a result, it is possible to sufficiently maintain an adhesive strength between the tape and the semiconductor wafer, and also to reduce a possibility that a semiconductor chip or a semiconductor device is fallen off from the tape.

Although exemplified in both the first and second embodiments is a case where the tape is stuck onto the back surface of the semiconductor wafer on which a variety of circuit patterns are not formed, and this sticking step is carried out before the dicing step, it is a matter of course that this is applied to a case where the tape is stuck onto the front surface of the semiconductor wafer on which a variety of circuit patterns are formed, and this sticking step is carried out before the polishing step applied to the back surface of the semiconductor wafer.

According to the apparatus for sticking the tape onto a semiconductor wafer and the method of sticking the tape onto the semiconductor wafer, an adhesive strength between the tape and semiconductor wafer can be sufficiently maintained and a possibility that the semiconductor chip or the semiconductor device is fallen off from the tape can be reduced.

What is claimed is:

1. An apparatus for sticking a tape onto a semiconductor wafer comprising:

a table for mounting the semiconductor wafer thereon;

a first tape roll around which a tape is wound;

a second tape roll for winding up the tape unwound from the first tape roll, the tape being under tension in a longitudinal direction thereof between the first tape roll and the second tape roll; and a taper roller disposed between the table and the first tape rolls and having a diameter which is tapered or reduced toward both ends thereof, the taper roller applying a tension to the tape in a lateral direction thereof just before the tape is fed to the table.

2. The apparatus for sticking a tape onto a semiconductor wafer according to claim 1, wherein the taper roller is disposed at a first surface said serving as a sticking surface of the tape.

3. The apparatus for sticking a tape onto a semiconductor wafer according to claim 1, wherein the taper roller is disposed at a non-sticking surface side of the tape.

4. The apparatus for sticking a tape onto a semiconductor wafer according to claim 1, wherein the tape is stuck onto a pattern forming surface of the semiconductor wafer.

5. The apparatus for sticking a tape onto a semiconductor wafer according to claim 1, wherein the tape is stuck onto a surface opposing a pattern forming surface of the semiconductor wafer.

6. A tape sticker for a semiconductor wafer, comprising:

a first tape roll having a tape;

a second tape roll for winding up the tape from the first tape roll, the tape being under tension in a longitudinal direction thereof between the first tape roll and the second tape roll;

a wafer table for mounting a semiconductor wafer thereon, the wafer table being raisable so as to cause the tape to stick to he semiconductor wafer; and a taper roller having a diameter reduced toward both ends thereof, the taper roller being disposed between the table and the first tape rolls, the taper roller applying a tension to the tape in a lateral direction thereof just before the tape is fed to the table.

7. A tape sticker according to claim 6, further comprising a cutter for cutting the tape.

8. A tape sticker according to claim 7, wherein the cutter includes an orientation flat cutter and a circumferential cutter.

9. A tape sticker according to claim 6, further comprising means for positioning the semiconductor wafer.

10. A tape sticker according to claim 6, further comprising a wafer carrier station stocking a plurality of semiconductor wafers.

11. A tape sticking device for a semiconductor wafer, comprising:

a first tape roll providing a tape;

a second tape roll winding up the tape from the first tape roll, the tape being under tension in a longitudinal direction thereof between the first tape roll and the second tape roll;

a wafer table for mounting a semiconductor wafer thereon, the wafer table being raisable so as to cause the tape to stick to the semiconductor wafer; and a taper roller having a first diameter at a center portion thereof and a second diameter that is smaller than the first diameter at both end portions thereof, the taper roller being disposed between the table and the first tape roller, the taper roller applying a tension to the tape in a lateral direction thereof just before the tape is fed to the table.

12. A tape sticker according to claim 11, further comprising a cutter.

13. A tape sticker according to claim 12, wherein the cutter includes an orientation flat cutter and a circumferential cutter.

14. A tape sticker according to claim 11, further comprising means for positioning the semiconductor wafer.

15. A tape sticker according to claim 11, further comprising a wafer carrier station stocking a plurality of semiconductor wafers.

* * * * *